United States Patent [19]
Yamauchi et al.

[11] Patent Number: 5,939,894
[45] Date of Patent: Aug. 17, 1999

[54] CMOS INTEGRATED CIRCUIT TESTING METHOD AND APPARATUS USING QUIESCENT POWER SUPPLY CURRENTS DATABASE

[75] Inventors: Hisashi Yamauchi; Fumihiko Tajima; Yoshiyuki Inomata, all of Tokyo, Japan

[73] Assignee: NEC Corporation, Tokyo, Japan

[21] Appl. No.: 08/741,424

[22] Filed: Oct. 24, 1996

[30] Foreign Application Priority Data

Mar. 28, 1996 [JP] Japan .................................. 8-074101

[51] Int. Cl.[6] ........................... G01R 31/28; G06F 9/455
[52] U.S. Cl. ............................................ 324/765; 364/578
[58] Field of Search ................................ 324/765, 158.1, 324/763; 371/22.5, 22.6, 25.1; 364/578; 395/500

[56] References Cited

U.S. PATENT DOCUMENTS 5,392,293  2/1995  Hsue ..................................... 324/158.1
5,731,700  3/1998  McDonald ............................. 324/765

OTHER PUBLICATIONS

"IEEE Design & Test of Computers", IEEE Computer Society, pp. 42–52, Summer (1995).

Primary Examiner—Ernest F. Karlsen
Attorney, Agent, or Firm—Foley & Lardner

[57] ABSTRACT

A CMOS integrated circuit is tested by creating a database in which types of CMOS functional units of the integrated circuit are mapped to values of quiescent power supply currents which would flow through the functional units corresponding to all possible internal states of the integrated circuit. A test pattern is applied to a simulation model of the functional units of the integrated circuits and an output is detected therefrom. Corresponding to the output of the simulation model, values of the quiescent power supply currents are read from the database and a decision threshold is derived from a total sum of the read values. A power supply current of the integrated circuit is then measured while subjecting it to the test pattern and the measured current is compared with the decision threshold to produce a test result of the integrated circuit.

9 Claims, 3 Drawing Sheets

CMOS INTEGRATED CIRCUIT TESTING METHOD AND APPARATUS USING QUIESCENT POWER SUPPLY CURRENTS DATABASE

BACKGROUND OF THE INVENTION

1. Field of the Invention

The present invention relates to a CMOS integrated circuit testing method and apparatus using quiescent power supply currents.

2. Description of the Related Art

In the past, CMOS (complementary metal oxide semiconductor) LSI (large-scale integration) chips were tested by observing output binary states in response to a given test pattern. This has necessitated a design that allows all data variations to propagate to the output terminals of the integrated circuit. To eliminate the complexity of the design required, a test method, known as the IDDQ test, his been developed utilizing quiescent power supply current of the CMOS LSI chip by taking advantage of the fact that current low exists only in response to a transition of its logic states and there is no current during quiescent states. Thus, if there is a power supply current during a quiescent state, this provides a clear indication of defects. However, due to the presence of circuitry formed with a pull-up resistor or a pull-down resistor, a substantial amount of power supply current will flow during quiescent states for particular test patterns. In order to ensure a high degree of precision, the conventional IDDQ test restricts the measurement to a limited range of possible internal states by excluding such test patterns. Thus, the fault coverage of the conventional method is low.

One solution is to provide switching circuits in the power supply lines of those logic units where a quiescent current of substantial value normally flows and operate the switching circuits to cut off the power supply when such logic units are tested, as described in a paper "IEEE Design & Test of Computers", published by the IEEE Computer Society, Summer 1995, pages 42 to 52. However, to implement such power cut-off switching circuits, a great number of transistors and terminals would be required, which represents a substantial amount of circuit overhead.

SUMMARY OF THE INVENTION

It is therefore an object of the present invention to provide a CMOS integrated circuit testing method and apparatus which gives a high fault coverage.

According to a first aspect, the present invention provides a method for testing an integrated circuit, comprising the steps of:
a) preparing a database by mapping types of CMOS functional units of the integrated circuit to values of quiescent power supply currents which would flow through the functional units corresponding to all possible internal states of the integrated circuit;
b) creating a simulation model of the functional units of the integrated circuit;
c) subjecting the simulation model to a test pattern and detecting an output representative of the internal states of the integrated circuit corresponding to the test pattern therefrom;
d) reading values of the quiescent power supply currents from the database corresponding to the output detected by the step (c);
e) producing a decision threshold from a total sum of the read values; and
f) measuring a power supply current of the integrated circuit by subjecting the integrated circuit to the test pattern and comparing the measured current with the decision threshold to produce a test result.

According to a second aspect, the present invention provides a method for testing an interface block of an integrated circuit chip, comprising the steps of:
a) preparing a database by mapping types of CMOS functional units of the interface block to values of quiescent power supply currents which would flow through the functional units corresponding to all possible internal states of the interface block;
b) preparing a test pattern file including a plurality of rest patterns;
c) preparing in input-output logic map defining relationships between a plurality of input binary states of the interface block and a plurality of output binary states of the interface block;
d) subjecting the logic map to a test pattern and detecting an output representative of the internal states of the interface block corresponding to the test pattern therefrom;
e) reading values of the quiescent power supply currents from the database corresponding to the output detected by the step (d);
f) producing a decision threshold from a total sum of the read values;
g) measuring a power supply current of the integrated circuit chip by subjecting the integrated circuit chip to the test pattern and comparing the measured current with the decision threshold to produce a test result.

According to a third aspect, the present invention provides a method for testing an internal circuit of in integrated circuit chip, the internal circuit being interfaced to external circuitry by an interface block whose input side is connected to input terminals of the internal circuit and whose output side is connected to output terminals of the internal circuit, comprising the steps of:
a) preparing a database by mapping types of CMOS functional units of the internal circuit to values representing the sum of quiescent power supply currents which would flow through the functional units of the internal circuit and quiescent power supply currents which would flow through said interface block, corresponding to all possible internal states of the internal circuit;
b) preparing a simulation model of the functional units of said internal circuit;
c) subjecting the simulation model to a test pattern and detecting an output representative of the internal states of the internal circuit corresponding to the test pattern therefrom;
d) reading values of said quiescent power supply currents from said database corresponding to the output detected by the step (c);
e) producing a decision threshold from a total sum of the read values; and
f) measuring a power supply current of the integrated circuit chip by subjecting the integrated circuit chip to the test pattern and comparing the measured current with said decision threshold to produce a test result.

BRIEF DESCRIPTION OF THE DRAWINGS

The present invention will be described in further detail with reference to the accompanying drawings, in which.

DETAILED DESCRIPTION

Figure 1:
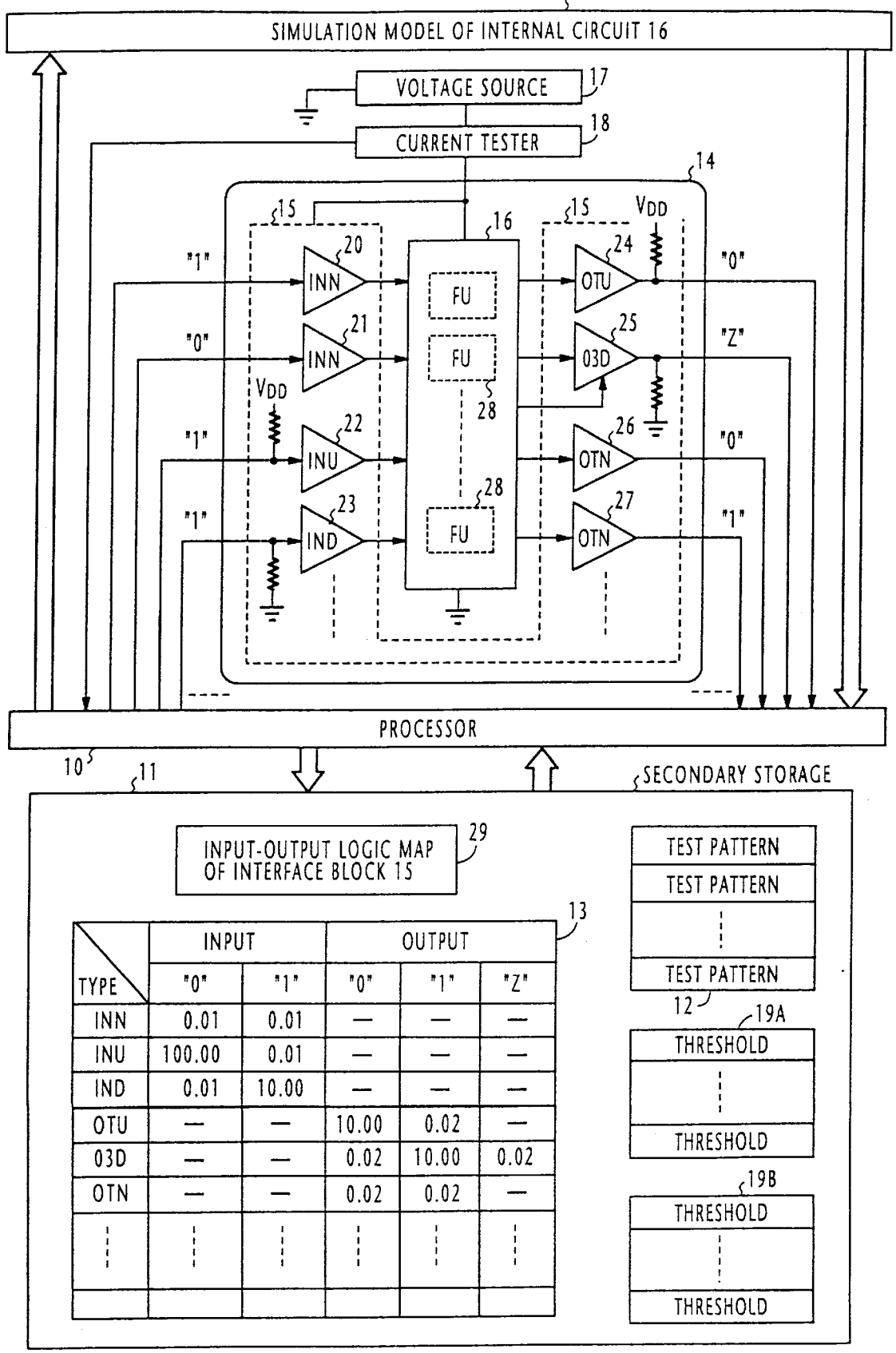
FIG. 1 is a block diagram of a testing arrangement for measuring a quiescent power supply current of an LSI chip according to the present invention.

In FIG. 1, there is shown a testing arrangement for measuring the quiescent power supply current of the interface block 15 and the internal circuit 16 of an LSI chip 14 according to the present invention. The testing arrangement includes a processor 10 and a secondary storage medium 11 in which a test pattern file 12, a database 13, threshold tables 19A, 19B and an input-output logic map 29 of interface block 15 are defined. The LSI chip 14 is activated by a power current supplied from a voltage source 17 through a current tester 18. The interface block 15 has an array of input CMOS functional units, or buffers 20 to 23 and an array of output CMOS functional units, or buffers 24 to 27. The internal circuit 16 has CMOS functional (logic) units 28. The processor 10 is connected to the input terminals of input functional blocks 20–23 which are connected to the internal circuit 16 whose outputs are connected to the functional blocks 24–27. The output terminals of functional blocks 24–27 are connected to the processor 10.

As a typical example the functional units 20 and 21 are input buffer of the same type where the input terminal is neither pulled down nor pulled up, the functional unit 22 is a buffer of a pull-up type whose input is connected to voltage supply $V_{DD}$ by a pull-up resistor and the functional unit 23 is a buffer of pull-down type whose input is connected to ground by a pull-down resistor. The output functional unit 24 is a pull-up buffer whose output is coupled to the voltage supply by a pull-up resistor. Functional unit 25 is a tri-state buffer whose output is grounded through a pull down resistor. Functional units 26 and 27 are buffers of the same type where the output terminal is neither pulled down nor pulled up.

Database 13 defines a look-up table in which the types of all CMOS functional units of the interface block 15 are mapped to the micro-ampere values of quiescent power supply currents which are supposed to flow corresponding to all possible internal states of the interface block 15. In addition, the types of all CMOS functional units of internal circuit 16 are mapped to the micro-ampere values of quiescent power supply currents which are supposed to flow corresponding to all possible internal states of the internal circuit 16. As a simplified example, the database 13 is shown to include a map for the input and output buffers of interface block 15. Note that, although not shown in FIG. 1, the quiescent power supply current values of the internal circuit 16 are represented by ampere values of the currents of the internal circuit 16 plus ampere values of currents which would flow through interface block 15 at the same time. The latter currents are determined by experiments.

Test pattern file 12 includes a plurality of test patterns for testing the LSI chip by setting up various logic states therein in successive stages. Appropriate test patterns are selected from the test pattern file 13 by the processor 10 when decision thresholds are derived for use in measuring the quiescent power supply current of the LSI chip. When the quiescent power supply current is being measured all the test patterns are used.

Input-output logic map 29 establishes relationships between a plurality of sets of input binary states of interface block 15 and a plurality of sets of output binary states of interface block 15 by treating the internal circuit 16 as if it were a black box since the current used by the internal circuit 16 is negligibly smaller than the power supply current of interface block 15. The output binary states of the logic map 29 represent internal states of the functional units of interface block 15. Using selected test patterns as input binary states, the processor 10 is able to detect output binary states that represent internal states of the functional units of interface block 15.

As indicated by numeral 30, a simulation model of the internal circuit 16 is provided to respond to one or more selected test patterns to produce a bit sequence representing internal states of its functional units 28.

Figure 2:
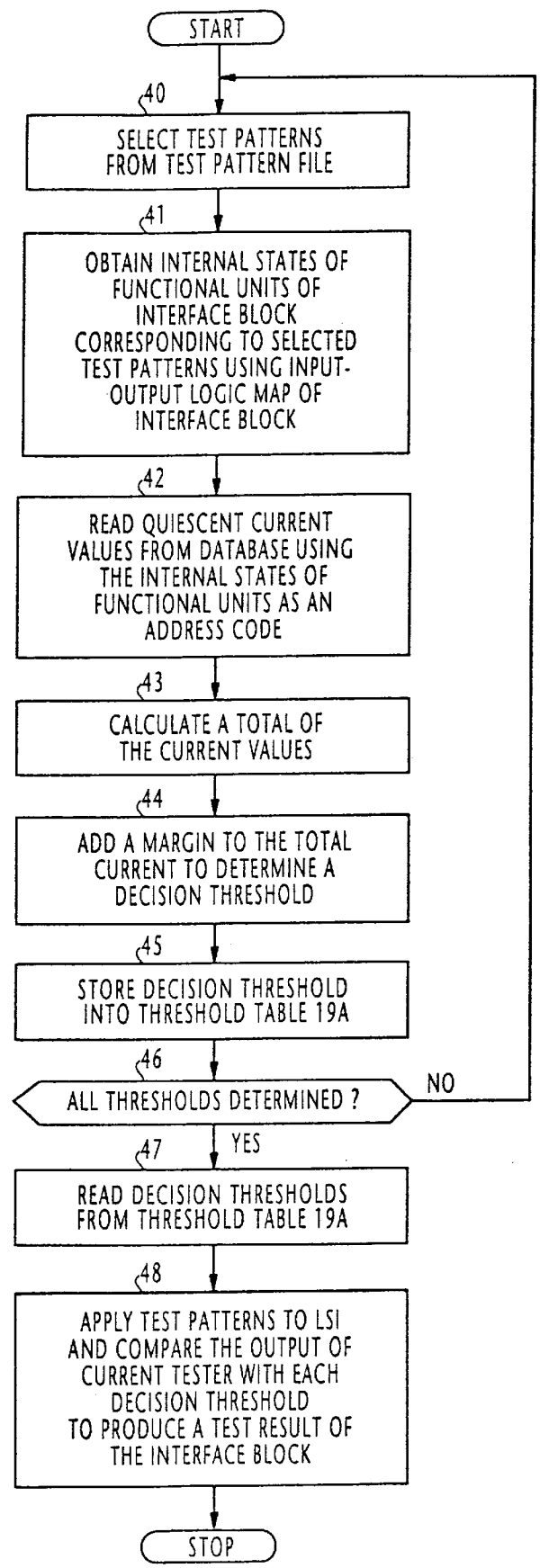
FIG. 2 is a flowchart of the operation of the processor for testing the interface block of the LSI chip.

In FIG. 2, the operation of the processor 10 of FIG. 1 for testing the interface block 15 begins with step 40 where the processor selects one or more test patterns from test pattern file 13 which are necessary for determining a decision threshold. At step 41, the processor uses the test patterns to obtain internal states of the functional units of interface block 15 from the input-output logic map 29 corresponding to the resultant output binary states.

At step 42, the processor uses the internal states of the interface block 15 (i.e., output binary states of logic map 29) as an address code to read a set of quiescent power supply current values from the database 13. Flow proceeds to step 43 where the processor calculates a total sum of the current values read from the database. As an example, FIG. 1 shows when input bits "1","0", "1", "1" are applied to buffers 20, 21, 22, 23, respectively, output bits "0", "Z", "0" and "1" appear at the outputs of buffers 24, 25, 26, 27, respectively. In this example, the processor will yield the following total current I:

$$I = I_{INN/1} + I_{INN/0} + I_{INU/1} + I_{IND/1} + I_{OTU/0} + I_{O3D/Z} + I_{OTN/0} + I_{OTN/1}$$

$$= 0.01 + 0.01 + 0.01 + 10.00 + 10.00 + 0.02 + 0.02 + 0.02$$

$$= 20.09 \ (\mu A)$$

At step 44, the processor produces a decision threshold (or limit) value $I_{th}$ by adding a measurement margin a to the total current I, giving a decision threshold current value $I_{th}$=20.09 $\mu$A+$\alpha$. The processor advances to step 45 to store the decision threshold into the threshold table 19A.

At step 46, the processor determines whether all decision thresholds that are necessary for testing the interface block 15 have been determined. If not, flow returns to step 40 to repeat the above process. If the decision at step 46 is affirmative, the processor proceeds from step 46 to step 47 to read all decision thresholds from the table 19A. At step 48, the processor reads all test patterers from the test pattern file 13 and sequentially supplies corresponding bit patterns to the input terminals of the LSI chip 14, reads a quiescent power supply current of the LSI chip 14 from the tester 18 and compares it with each of the decision thresholds to produce a test result of the interface block 15, indicating whether the measured quiescent current is higher or lower than each of the decision thresholds.

Figure 3:
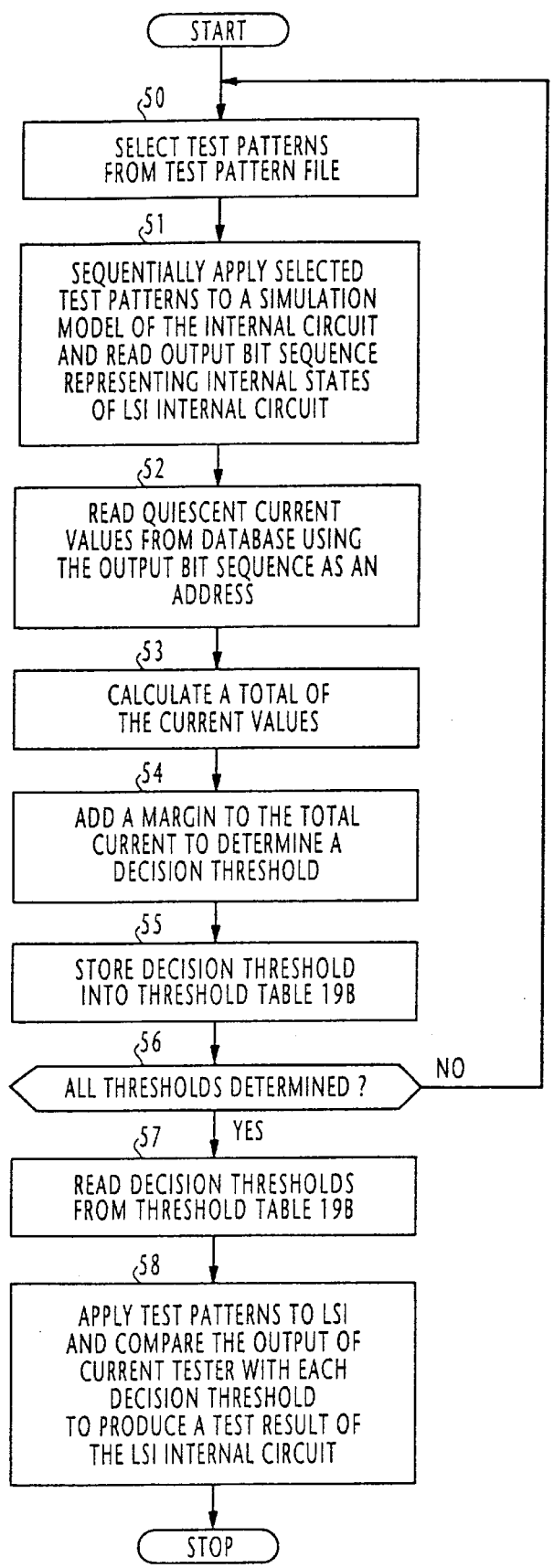
FIG. 3 is a flowchart of the operation of the processor for testing the internal circuit of the LSI chip.

When testing the internal circuit 16, the operation of the processor 10 begins with step 50 of the flowchart of FIG. 3 by selecting one or more appropriate test patterns from the test pattern file 12 for deriving decision thresholds necessary for all the functional units 28 of the internal circuit 16. At step 51, the processor sequentially supplies the selected test patterns to the simulation model 30 and reads a sequence of output bit patterns delivered from the simulation model. This output bit sequence represents internal states of the functional units 28 for a particular decision threshold. At step 52, the processor uses the output bit sequence as an a address code to read a set of quiescent power supply current values from the database 13, and at step 53, calculates a total sum of the current values. A measurement margin is added to the total current to determine the particular decision threshold (step 54). At step 55, the decision threshold is stored in the threshold table 19B.

At step 56, the processor determines whether all decision thresholds that are necessary for testing the internal circuit 16 have been determined. If not, flow returns to step 50 to repeat the above process. If the decision at step 56 is affirmative, the processor proceeds from step 56 to step 57 to read all decision thresholds from the table 19B. At step 58, the processor reads a series of test patterns from the test pattern file 13 and sequentially supplies corresponding bit patterns to the input terminals of the LSI chip 14, reads a quiescent power supply current of the LSI chip 14 from the tester 18 and compares it with each of the decision thresholds to produce a test result of the internal circuit 16.

What is claimed is:

1. A method for testing an integrated circuit, comprising the steps of:
   a) preparing a database by mapping types of CMOS (complementary metal oxide semiconductor) functional units of the integrated circuit to values of quiescent power supply currents which would flow through said functional units corresponding to internal states of the integrated circuit;
   b) creating a simulation model of the functional units of said integrated circuit;
   c) subjecting the simulation model to a test pattern and detecting an output representative of the internal states of the integrated circuit corresponding to the test pattern;
   d) reading values of said quiescent power supply currents from said database corresponding to the output detected by the step (c);
   e) producing a decision threshold from a total sum of the read values; and
   f) measuring a power supply current of the integrated circuit by subjecting the integrated circuit to the test pattern and comparing the measured current with said decision threshold to produce a test result.

2. A method for testing an integrated circuit, comprising the steps of:
   a) preparing a database by mapping types of CMOS (complementary metal oxide semiconductor) functional units of the integrated circuit to values of quiescent power supply currents which would flow through said functional units corresponding to internal states of the integrated circuit;
   b) preparing a test pattern file including a plurality of test patterns; and
   c) creating a simulation model of the functional units of said integrated circuit;
   d) selecting a test pattern from the test pattern file;
   e) subjecting the simulation model to the selected test pattern and detecting an output therefrom;
   f) reading values of said quiescent power supply currents from said database corresponding to the output detected by the step (e);
   g) producing a decision threshold from a total sum of the read values;
   h) storing the decision threshold in a threshold table;
   i) repeating the steps (d) to (h); and
   j) measuring a power supply current of the integrated circuit by subjecting the integrated circuit to the plurality of test patterns and comparing each measured current with a respective one of the decision thresholds stored in the threshold table to produce a test result.

3. A method for testing an interface block connected to an internal circuit of an integrated circuit chip, comprising the steps of:
   a) preparing a database by mapping types of CMOS (complementary metal oxide semiconductor) functional units of the interface block to values of quiescent power supply currents which would flow through said functional units corresponding to internal states of the interface block;
   b) preparing a test pattern file including a plurality of test patterns;
   c) preparing an input-output logic map defining relationships between a plurality of input binary states of said interface block corresponding to the plurality of test patterns and a plurality of output binary states of the interface block;
   d) subjecting the logic map to a test pattern from the test pattern file and detecting an output representative of the internal states of the interface block corresponding to the test pattern;
   e) reading values of said quiescent power supply currents from said database corresponding to the output detected by the step (d);
   f) producing a decision threshold from a total sum of the read values;
   g) measuring a power supply current of the integrated circuit chip by subjecting the integrated circuit chip to the test pattern and comparing the measured current with the decision threshold to produce a test result.

4. A method for testing an interface block connected to an internal circuit of an integrated circuit chip, comprising the steps of:
   a) preparing a database by mapping types of CMOS (complementary metal oxide semiconductor) functional units of the interface block to values of quiescent power supply currents which would flow through said functional units corresponding to internal states of the interface block;
   b) preparing a test pattern file including a plurality of test patterns;
   c) preparing an input-output logic map defining relationships between a plurality of input binary states of said interface block corresponding to the plurality of test patterns and a plurality of output binary states of the interface block;
   d) selecting a test pattern from the test pattern file;
   e) subjecting the logic map to the selected test pattern and detecting an output representative of the internal states of the interface block corresponding to the test pattern;
   f) reading values of said quiescent power supply currents from said database corresponding to the output detected by the step (e);
   g) producing a decision threshold from a total sum of the read values;
   h) storing the decision threshold in a threshold table;
   i) repeating the steps (d) to (h); and
   j) measuring a power supply current of the integrated circuit chip by subjecting the integrated circuit chip to the plurality of test patterns and comparing each measured current with a respective one of the decision thresholds stored in the threshold table to produce a test result.

5. A method for testing an internal circuit of an integrated circuit chip, the internal circuit being interfaced to an external circuitry by an interface block whose input side is connected to input terminals of the internal circuit and whose output side is connected to output terminals of the internal circuit, comprising the steps of:

a) preparing a database by mapping types of CMOS (complementary metal oxide semiconductor) functional units of the internal circuit to values representative of a sum of quiescent power supply currents which would flow through the functional units of the internal circuit and quiescent power supply currents which would flow through said interface block, corresponding to internal states of the internal circuit;

b) preparing a simulation model of the functional units of said internal circuit;

c) subjecting the simulation model to a test pattern and detecting an output representative of the internal states of the internal circuit corresponding to the test pattern;

d) reading values of said quiescent power supply currents from said database corresponding to the output detected by the step (c);

e) producing a decision threshold from a total sum of the read values; and f) measuring a power supply current of the integrated circuit chip by subjecting the integrated circuit chip to the test pattern and comparing the measured current with said decision threshold to produce a test result.

6. A method for testing an internal circuit of an integrated circuit chip, the internal circuit being interfaced to an external circuitry by an interface block whose input side is connected to input terminals of the internal circuit and whose output side is connected to output terminals of the internal circuit, comprising the steps of:

a) preparing a database by mapping types of CMOS (complementary metal oxide semiconductor) functional units of the internal circuit to values representative of the sum of quiescent power supply currents which would flow through the functional units of the internal circuit and quiescent power supply currents which would flow through said interface block, corresponding to internal states of the internal circuit;

b) preparing a simulation model of the functional units of said internal circuit;

c) preparing a test pattern file including a plurality of test patterns;

d) selecting a test pattern from the test pattern file;

e) subjecting the simulation model to the selected test pattern and detecting an output representative of the internal states of the internal circuit corresponding to the test pattern;

f) reading values of said quiescent power supply currents from said database corresponding to the output detected by the step (e);

g) producing a decision threshold from a total sum of the read values;

h) storing the decision threshold in a threshold table;

i) repeating the steps (d) to (h); and j) measuring a power supply current of the integrated circuit chip by subjecting the integrated circuit chip to the plurality of test patterns and comparing each measured current with a respective one of decision thresholds stored in the threshold table to produce a test result.

7. An apparatus for testing an integrated circuit, comprising:

a secondary storage for storing a database in which types of CMOS (complementary metal oxide semiconductor) functional units of the integrated circuit are mapped to values of quiescent power supply current which would flow through said functional units corresponding to internal states of the integrated circuit;

a simulation model of the functional units of said integrated circuit;

a current measuring device for measuring a power supply current of the integrated circuit; and a processor for supplying a test pattern to the simulation model and detecting an output representative of the internal states of the integrated circuit corresponding to the test pattern, reading values of said quiescent power supply currents from said database corresponding to the detected output, producing a decision threshold from a total sum of the read values, subjecting the integrated circuit to the test pattern, and comparing a current measured by said current measuring device with said decision threshold to produce a test result.

8. An apparatus for testing an interface block of an integrated circuit chip, an internal circuit of the integrated chip being interfaced to an external circuitry by the interface block whose input side is connected to input terminals of the internal circuit and whose output side is connected to output terminals of the internal circuit, the apparatus comprising:

a secondary storage for storing a database in which types of CMOS (complementary metal oxide semiconductor) functional units of the interface block are mapped to values of quiescent power supply current which would flow through said functional units corresponding to internal states of the interface block and an input-output logic map defining relationships between a plurality of input binary states of said interface block and a plurality of output binary states of the interface block;

a current measuring device for measuring a power supply current of the integrated circuit chip; and a processor for reading an output representative of the internal states of the interface block from the logic map in response to a test pattern including input binary states of said interface block, reading values of said quiescent power supply currents from said database corresponding to the read output, producing a decision threshold from a total sum of the read values, subjecting the integrated circuit chip to the test pattern, and comparing a current measured by the current measuring device with said decision threshold to produce a test result.

9. An apparatus for testing an internal circuit of an integrated circuit chip, the internal circuit being interfaced to external circuitry by an interface block whose input side is connected to input terminals of the internal circuit and whose output side is connected to output terminals of the internal circuit, comprising:

a secondary storage for storing a database in which types of CMOS (complementary metal oxide semiconductor) functional units of the internal circuit are mapped to values representative of the sum of quiescent power supply currents which would flow through the functional units of the internal circuit and quiescent power supply currents which would flow through said interface block, corresponding to internal states of the internal circuit;

a simulation model of the functional units of said internal circuit; a current measuring device for measuring a power supply current of the integrated circuit chip; and a processor for subjecting the simulation model to a test pattern, detecting an output representative of the internal states of the internal circuit corresponding to the test pattern, reading values of said quiescent power supply currents from said database corresponding to the detected output, producing a decision threshold from a total sum of the read values, subjecting the integrated circuit chip to the test pattern, and comparing a current measured by the current measuring device with said decision threshold to produce a test result.

* * * * *